(12) United States Patent
Choi et al.

(10) Patent No.: US 10,269,725 B2
(45) Date of Patent: Apr. 23, 2019

(54) SEMICONDUCTOR PACKAGE AND METHOD OF MANUFACTURING THE SAME

(71) Applicant: SAMSUNG ELECTRO-MECHANICS CO., LTD., Suwon-si (KR)

(72) Inventors: Jong Woo Choi, Suwon-si (KR); Hyun Kook Cho, Suwon-si (KR); Hyuk Joo Yoon, Suwon-si (KR); Hyuk Ki Kwon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/634,074

(22) Filed: Jun. 27, 2017

(65) Prior Publication Data
US 2018/0019211 A1    Jan. 18, 2018

(30) Foreign Application Priority Data

Jul. 18, 2016 (KR) .................. 10-2016-0090965
Mar. 16, 2017 (KR) .................. 10-2017-0033319

(51) Int. Cl.
*H01L 23/552* (2006.01)
*H01L 23/31* (2006.01)
*H01L 23/498* (2006.01)
*H01L 23/13* (2006.01)
*H01L 23/00* (2006.01)
(Continued)

(52) U.S. Cl.
CPC ............ *H01L 23/552* (2013.01); *H01L 21/56* (2013.01); *H01L 23/13* (2013.01); *H01L 23/3121* (2013.01); *H01L 23/49822* (2013.01); *H01L 23/49827* (2013.01); *H01L 23/49838* (2013.01); *H01L 24/17* (2013.01); *H01L 24/81* (2013.01); *H01L 24/97* (2013.01); *H01L 21/561* (2013.01); *H01L 21/6836* (2013.01); *H01L 23/3128* (2013.01); *H01L 24/16* (2013.01); *H01L 2224/16227* (2013.01); *H01L 2224/97* (2013.01); *H01L 2924/14* (2013.01); *H01L 2924/15159* (2013.01); *H01L 2924/15311* (2013.01); *H01L 2924/15313* (2013.01);
(Continued)

(58) Field of Classification Search
CPC ....... H01L 21/56; H01L 23/552; H01L 23/13; H01L 23/3121; H01L 23/49827; H01L 23/49822; H01L 23/49838; H01L 24/17; H01L 24/81; H01L 24/97
See application file for complete search history.

(56) References Cited

U.S. PATENT DOCUMENTS

2003/0003622 A1*  1/2003  Ishizu ................ H01L 21/50
                                                         438/106
2018/0204805 A1*  7/2018  Kawabata ........... H01F 1/14708

FOREIGN PATENT DOCUMENTS

JP  2011228322 A  * 11/2011  ......... H01L 21/6836
KR  10-1046250 B1    6/2011
KR  10-1247719 B1    3/2013

* cited by examiner

Primary Examiner — Allan R Wilson
(74) Attorney, Agent, or Firm — NSIP Law

(57) ABSTRACT

A semiconductor package includes a substrate including at least one mounted electronic device; a sealer disposed to seal the electronic device; and a conductive blocking film disposed on a surface of the sealer and a side surface of the substrate, wherein the substrate includes a spacer formed along an outer edge of a lower surface of the substrate to space the side surface of the substrate and the lower surface of the substrate to be apart from each other.

12 Claims, 11 Drawing Sheets

(51) Int. Cl.
*H01L 21/56* (2006.01)
*H01L 21/683* (2006.01)
(52) U.S. Cl.
CPC ............... *H01L 2924/19105* (2013.01); *H01L 2924/3025* (2013.01)

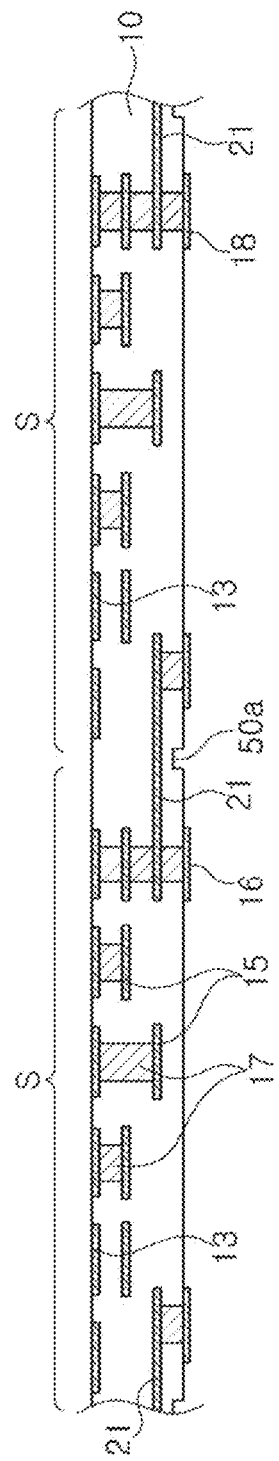
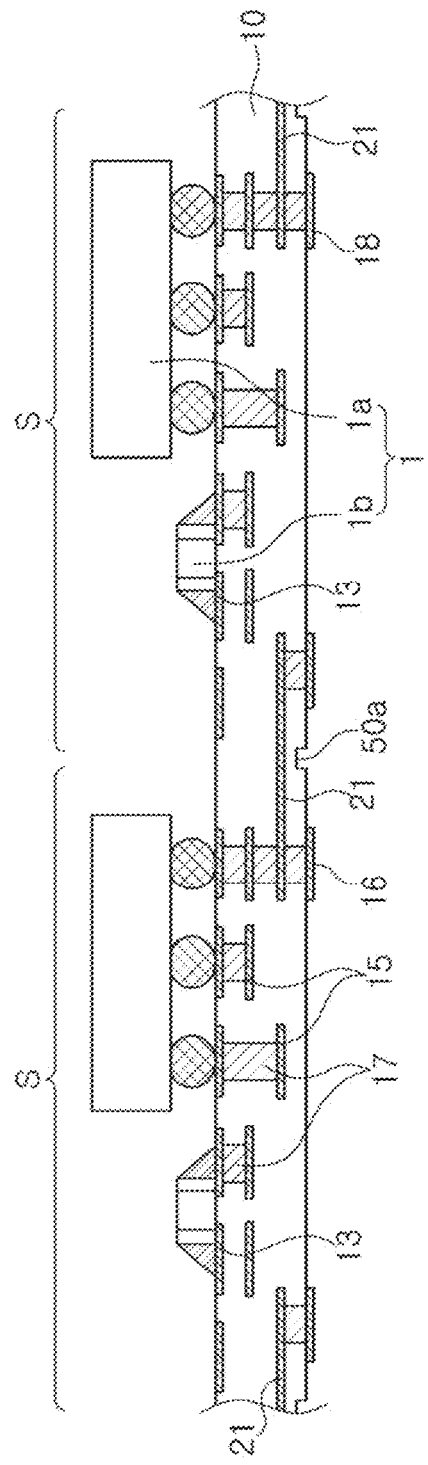

SEMICONDUCTOR PACKAGE AND METHOD OF MANUFACTURING THE SAME

CROSS-REFERENCE TO RELATED APPLICATION(S)

This application claims benefit under 35 USC 119(a) of Korean Patent Application Nos. 10-2016-0090965, filed on Jul. 18, 2016 and 10-2017-0033319, filed on Mar. 16, 2017 in the Korean Intellectual Property Office, the disclosure of which is incorporated herein by reference for all purposes.

BACKGROUND

1. Field

The present disclosure relates to a semiconductor package and a method of manufacturing the same.

2. Description of Related Art

For electronic products, demand for portable apparatuses has recently increased rapidly in the market. Therefore, miniaturization and lightness of electronic devices mounted in the electronic products is continuously sought after.

In order to realize the miniaturization and lightness of the electronic devices, system on chip (SOC) technology, implementing a plurality of individual devices on one chip, system in package (SIP) technology, integrating a plurality of individual devices in one module, and the like, as well as technology decreasing the individual sizes of mounted components, are required.

However, as the size of semiconductor packages is reduced and the semiconductor packages are designed in a circuit-integrated structure, semiconductor packages are easily affected by electromagnetic interference. Therefore, in order to prevent the semiconductor package from being affected by the electromagnetic interference, a blocking film or an electromagnetic shield is formed on the surface of the semiconductor package by a metal coating process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package includes a substrate including at least one mounted electronic device; a sealer disposed to seal the electronic device; and a conductive blocking film disposed on a surface of the sealer and a side surface of the substrate, wherein the substrate includes a spacer formed along an outer edge of a lower surface of the substrate to space the side surface of the substrate and the lower surface of the substrate to be apart from each other.

The spacer may have a step shape.

The spacer may include a first surface horizontally extending from a lower portion of the side surface of the substrate; and a second surface vertically extending from the first surface and connected to the lower surface of the substrate.

The spacer may be formed as an inclined surface or a curved surface.

In the spacer, a width of the first surface may be greater than that of the second surface.

A vertical spaced distance between the side surface of the substrate and the lower surface of the substrate may be greater than a thickness of the conductive blocking film.

The substrate includes an insulating layer, a wiring layer disposed on a lower surface of the insulating layer, and an insulation protecting layer formed on the lower surface of the insulating layer while covering the wiring layer, and the spacer is formed by a difference in an area between the insulating layer and the insulation protecting layer.

The spacer may be formed in a shape of a groove, and a ratio of a horizontal distance of the groove and a vertical distance of the groove may be $1.8 \leq A/B \leq 2.2$, where A is the horizontal distance of the groove and B is the vertical distance of the groove.

In another general aspect, a method of manufacturing a semiconductor package, includes preparing a strip substrate having a groove formed in a lower surface thereof; mounting an electronic device on one surface of the strip substrate; forming a sealer sealing the electronic device; cutting the strip substrate on which the sealer is formed along the groove to form a semiconductor package in a half-finished product state, the cut groove defining a spacer; and forming a conductive blocking film on a surface of the sealer and a surface of the cut strip substrate.

The conductive blocking film may be formed by a sputtering deposition or conformal coating scheme.

The forming of the conductive blocking film may include seating the semiconductor package in the half-finished product state on a base board; applying a conductive material onto the base board and a surface of the semiconductor package in the half-finished product state; and separating the semiconductor package from the base board.

In the applying of the conductive material, the conductive material applied onto the base board and the conductive material applied onto the surface of the semiconductor package in the half-finished product state may be discontinuously formed by the spacer.

In another general aspect, a method of manufacturing a semiconductor package, includes mounting an electronic device on one surface of a substrate; forming a sealer sealing the electronic device; seating the substrate on which the sealer is formed, on a base board; applying a conductive material onto a surface of the sealer and a side surface of the substrate; and separating the semiconductor package from the base board, wherein, when the substrate is seated on the base board, a lower portion of the side surface of the substrate is spaced apart from the base board.

The lower portion of the side surface of the substrate may be spaced apart from the base board by a support layer disposed on the base board, and formed to have an area smaller than that of the substrate, to be thus interposed between the base board and the substrate.

A ratio of a width of the substrate and a thickness of the support layer may be $1.8 \leq A/B \leq 2.2$, where A is the width of the substrate, exposed externally from the support layer, and B is the thickness of the support layer.

In another general aspect, a semiconductor package, including a substrate comprising an electronic device, the substrate having a first periphery surface and a second periphery surface; a sealer disposed to seal the electronic device; and a conductive blocking film disposed on a surface of the sealer and the first periphery surface the substrate, wherein the first periphery surface has a larger perimeter than a perimeter of the second periphery surface.

A lower portion of the first periphery surface and the second periphery surface may be define a groove.

A ratio of a horizontal depth and a vertical height of the groove may be defined by $1.8 \leq A/B \leq 2.2$, where A is the horizontal depth and B is the vertical height.

Other features and aspects will be apparent from the following detailed description, the drawings, and the claims.

BRIEF DESCRIPTION OF DRAWINGS

FIGS. 3A through 3E are cross-sectional views for describing an example of a method of manufacturing a semiconductor package.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
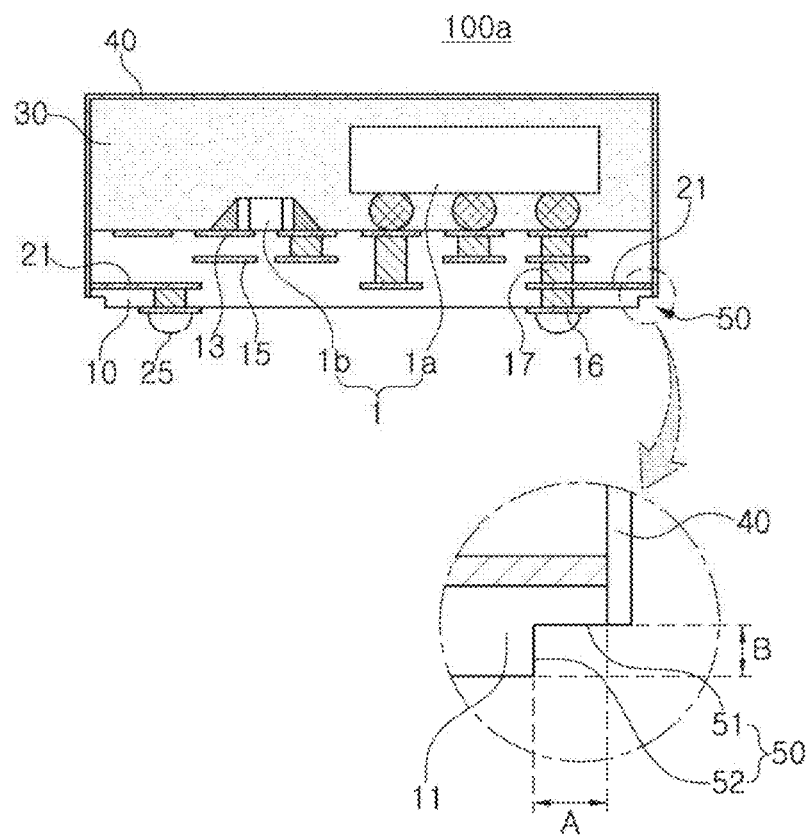
FIG. 1 is a cross-sectional view schematically illustrating an example of a semiconductor package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view schematically illustrating an example of a semiconductor package. In addition, FIG. 2 is a partially cut-away perspective view schematically illustrating an example of an inner portion of the semiconductor package illustrated in FIG. 1.

Figure 2:
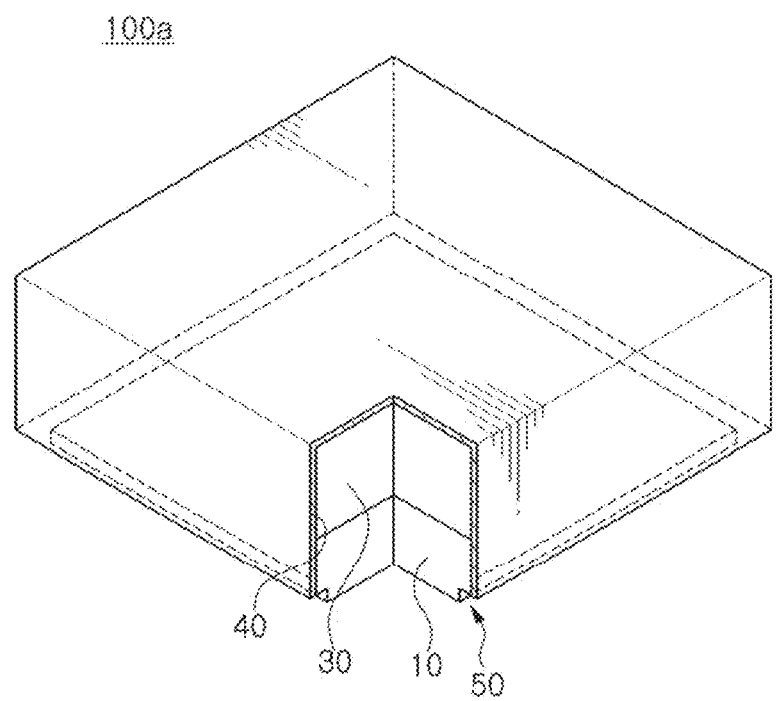
FIG. 2 is a partially cut-away perspective view schematically illustrating an example of an inner portion of the semiconductor package illustrated in FIG. 1.

Referring to FIGS. 1 and 2, a semiconductor package 100a includes electronic devices 1, a substrate 10, a sealing part 30, and a blocking film 40.

The electronic devices 1 include various devices such as an active device 1a and a passive device 1b, and may be any electronic devices that may be mounted on the substrate.

The electronic devices 1 are mounted on one surface of a substrate 10, to be described below. An example in which the active device 1a and the passive device 1b are mounted together on an upper surface of the substrate 10 is illustrated by way of example in FIG. 1. However, the electronic devices 1 are not limited to being mounted as described above, but may be disposed in various forms depending on sizes or forms thereof and a design of the semiconductor package 100a.

At least one ground electrode 21 is included in the substrate 10.

The ground electrode 21 is disposed in a form of a circuit pattern in the substrate 10, and is electrically connected to a blocking film 40, to be described below.

In the substrate 10, the ground electrode 21 is exposed through a side surface of the substrate 10. However, the substrate 10 is not limited thereto. For example, the ground electrode may also be disposed on the upper surface of the substrate 10.

In addition, the substrate 10 includes a spacing part 50, formed along an outer edge of lower and side surfaces of the substrate 10. The spacing part 50 spaces apart the side surface of the substrate 10 and the lower surface of the substrate 10.

The spacing part 50 is formed as a groove having a step shape along an edge of the substrate 10 at which the side surface and the lower surface of the substrate 10 meet each other, and includes a first surface 51 and a second surface 52.

The first surface 51 refers to a surface horizontally extending from a lower portion of the side surface of the substrate 10 to the center of the substrate 10, and the second surface 52 refers to a surface vertically extending downward from the first surface 51 and connected to the lower surface of the substrate 10. Therefore, a horizontal length of the groove is the same as a width A of the first surface 51, and a vertical length of the groove is the same as a width B of the second surface 52.

In the present example, the first surface 51 is formed to be perpendicular to the second surface 52. However, the first surface 51 and the second surface 52 are not limited thereto, and may be modified differently. For example, at least one of the first surface 51 and the second surface 52 may be formed as an inclined surface rather than a perpendicular surface.

As the substrate 10, various kinds of substrates (for example, a ceramic substrate, a printed circuit board (PCB), a flexible substrate, and the like) well-known in the art may be used. In addition, mounting electrodes 13 for mounting the electronic devices 1, the external connection electrodes 16, to which connection terminals 25 are bonded, and the like, is formed on both surfaces of the substrate 10.

In addition, the substrate 10 includes conductive vias 17 electrically connecting the mounting electrodes 13, the external connection electrodes 16, and wiring layers 15 in the substrate 10, to one another.

The substrate 10 described above is a multilayer substrate in which a plurality of insulating layers and a plurality of wiring layers 15 are repeatedly stacked.

The sealing part 30 seals the electronic devices 1 mounted on the substrate 10. In addition, the sealing part 30 is filled between the electronic devices 1 mounted on the substrate 10 to prevent an electrical short-circuit from being generated between the electronic devices 1, and fixes the electronic devices 1 onto the substrate 10 while enclosing outer portions of the electronic devices 1 to safely protect the electronic devices 1 from external impact.

The sealing part 30 is formed of an insulating resin material such as an epoxy molding compound (EMC). However, the sealing part 30 is not limited thereto.

The sealing part 30 is formed to completely cover one surface of the substrate 10. In addition, a case in which all the electronic devices 1 are completely buried in the sealing part 30 is described by way of example. However, all the electronic devices 1 are not limited to being buried in the sealing part 30. For example, at least one of the electronic devices 1 buried in the sealing part 30 may be partially exposed externally from the sealing part 30.

The sealing part 30 is formed by disposing the substrate 10, on which the electronic devices 1 are mounted in a mold (not illustrated), and injecting a molding resin into the mold.

The blocking film 40 blocks unnecessary external electromagnetic interference. In addition, the blocking film 40 may block electromagnetic interference generated in the electronic devices 1 from being externally radiated.

The blocking film 40 is disposed to cover surfaces of the sealing part 10 and the substrate 10.

Further, in the semiconductor package 100a, the blocking film 40 is electrically connected to the ground electrode 21. The blocking film 40 is formed along an outer surface of the sealing part 30, and extends up to the side surfaces of the substrate 10, to be electrically connected to the ground electrode 21 exposed to the side surface of the substrate 10.

As described above, the ground electrode 21 is exposed through the side surface of the substrate 10 and bonded to the blocking film 40.

The blocking film 40 is formed of various materials having conductivity. The blocking film 40 is formed by applying a resin material including conductive powders onto the outer surface of the sealing part 30 or by forming a thin metal film on the outer surface of the sealing part 30. In an example of forming the thin metal film, various kinds of technology, such as a sputtering method, a vapor deposition method, a screen printing method, an electroplating method, and an electroless plating method, may be used.

For example, the blocking film 40 is a thin metal film formed on the outer surface of the sealing part 30 by a conformal coating method. The conformal coating method may have the advantages that a uniform coating film may be formed, and that a cost required for equipment investment is smaller, as compared to other processes. However, the blocking film 40 is not limited thereto.

Next, a method of manufacturing a semiconductor package will be described.

FIGS. 3A through 3E are views illustrating an example of a method of manufacturing a semiconductor package based on a sequence of processes.

Figure 3C:
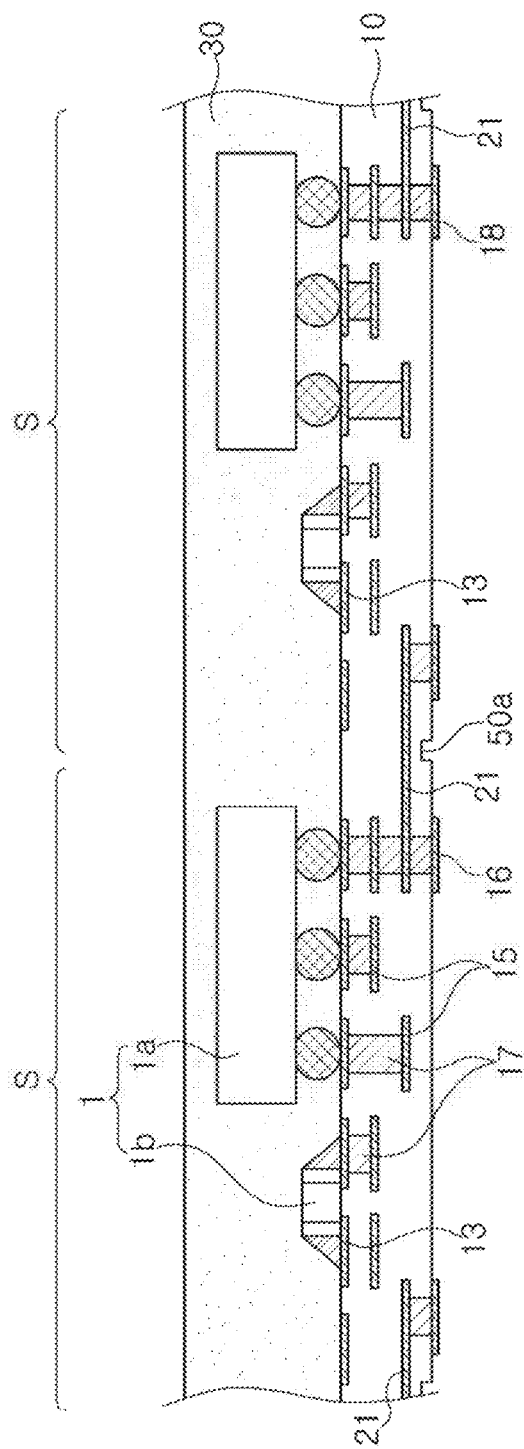

Referring to FIGS. 3A through 3E, as illustrated in FIG. 3A, a process of preparing the substrate 10 is first performed.

The substrate 10, which is a multilayer circuit substrate 10 including a plurality of layers, includes the wiring layers 15, on which a circuit pattern is formed, the external connection electrodes 16, the mounting electrodes 13, the ground electrode 21, the conductive vias 17, and the like.

However, a substrate (hereinafter, referred to as a strip substrate) having a panel form or a strip form may also be used as the substrate 10. The purpose of the strip substrate is to manufacture and form a plurality of semiconductor packages 100a simultaneously, while also allowing a plurality of individual package regions S to be divided on the strip substrate. The plurality of semiconductor packages 100a may also be simultaneously manufactured for each of the plurality of individual package regions S.

A groove 50a, for forming the spacing part 50 (see FIG. 1), is formed in the lower surface of the substrate 10. The groove 50a is formed along a boundary between the individual package regions S.

The groove 50a is formed at a depth that is the same as the width of the second surface 52 of the spacing part 50. In addition, when the strip substrate is cut, one groove 50a is separated into two spacing parts 50. Therefore, the groove 50a is formed at a width twice or greater than that of the first surface 51 of the spacing part 50.

Then, as illustrated in FIG. 3B, a process of mounting the electronic devices 1 on one surface of the substrate 10 is performed. In an example in which the strip substrate is used as described above, the electronic devices 1 may be repeatedly mounted in all of the individual package regions S of the substrate 10.

Then, as illustrated in FIG. 3C, a process of sealing the electronic devices 1 to form the sealing part 30 on one surface of the substrate 10 is performed.

In the case in which the strip substrate 10 is used, the sealing part 30 is formed in an integrated shape to cover all of the individual package regions S of the strip substrate 10. However, the sealing part 30 may also be separated for each of the individual package regions S, if necessary.

The sealing part 30 may be formed by injection-molding an insulating material such as an epoxy molding compound (EMC) on the substrate 10.

Although not illustrated, the method of manufacturing a semiconductor package may further include a process of removing a portion of the sealing part 30 after the sealing part 30 is formed. This process may be performed by grinding an upper portion of the sealing part 30 by a grinder.

The thickness of the sealing part 30 is significantly reduced through this process. An excessive increase in the entire thickness of the semiconductor package 100a, generated during the formation process of the sealing part, is prevented through this process.

Figure 3D:
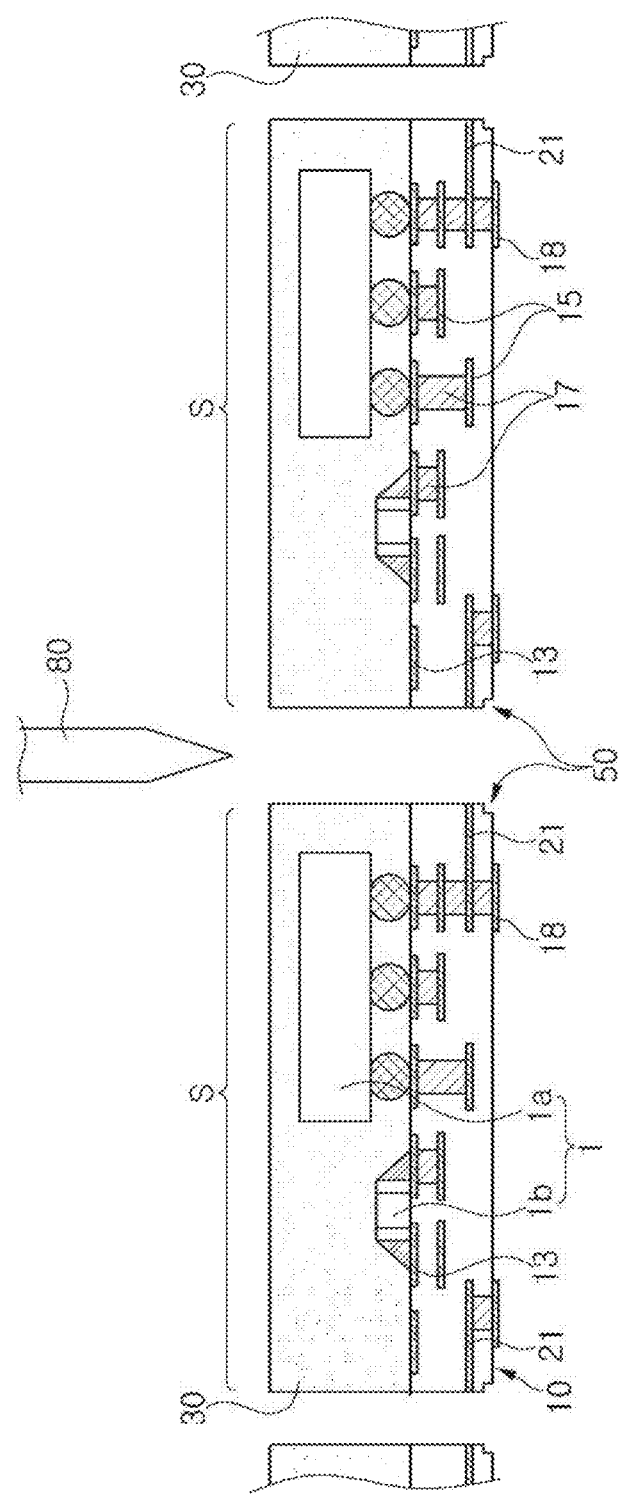

Then, as illustrated in FIG. 3D, a process of cutting the sealing part 30 and the strip substrate 10 using a blade 80 is performed.

The blade 80 cuts the strip substrate 10 along the boundary between the individual package regions S, that is, in the center of the groove 50a formed in the lower surface of the substrate 10. Therefore, semiconductor packages in a half-finished product state, in which the spacing parts 50 are formed on outer edges of the lower surface of the substrate 10, are manufactured.

A full cut process may be performed as the cutting process. The full cut process refers to a process of cutting upper and lower surfaces of a structure at the same time, using the blade 80. The full cut process forms cut surfaces of the individual semiconductor packages 100a more smoothly, and forms sizes of the respective semiconductor packages 100a more uniformly, as compared to a process of first cutting a portion of a structure (for example, a substrate on which a sealing part is formed) and secondarily cutting the remaining portions of the structure that are not cut, to separate the structure.

Figure 3E:
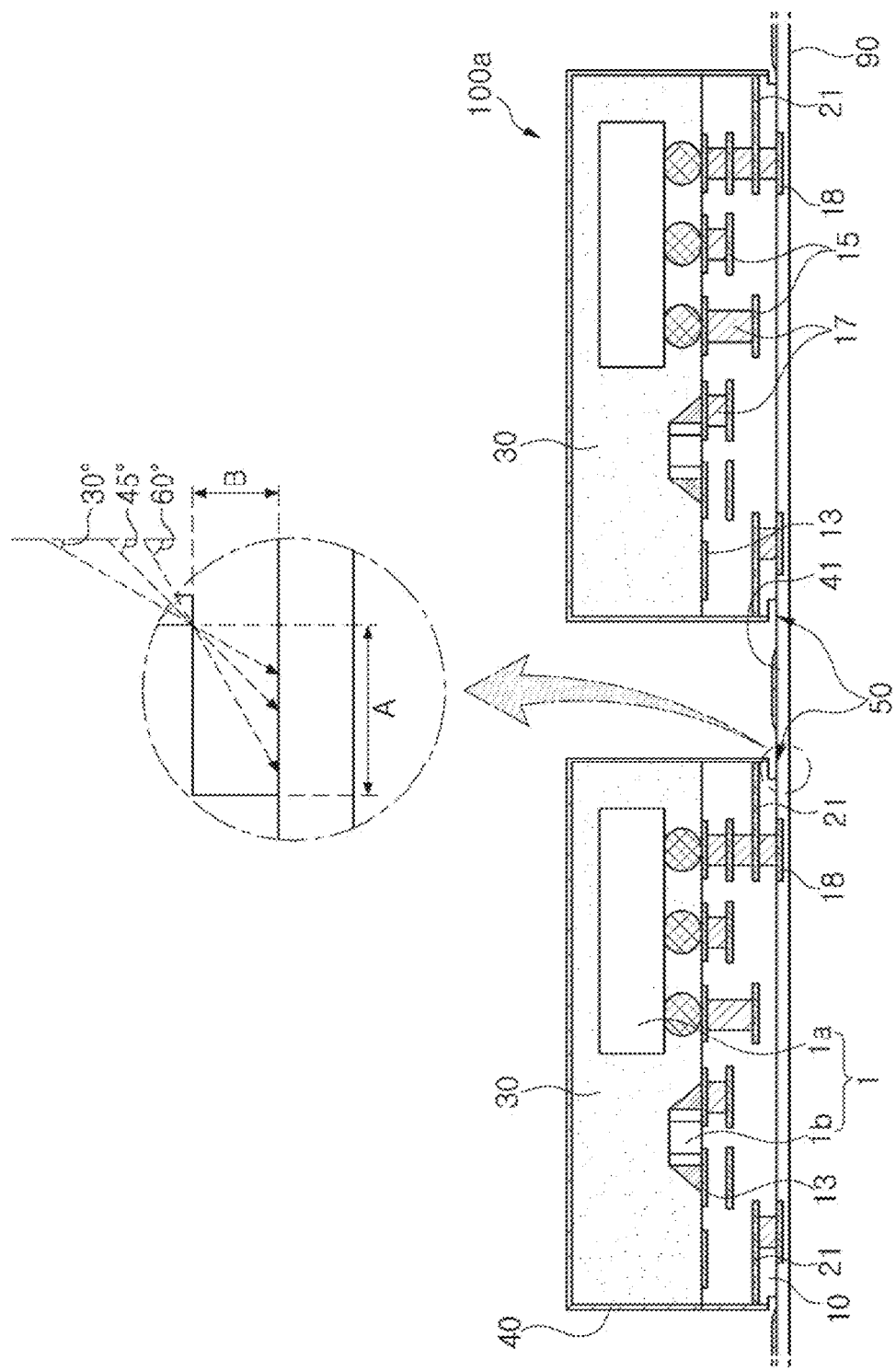

As illustrated in FIG. 3E, a process of forming the blocking film 40 on the outer surfaces of the sealing part 30 and the substrate 10 is performed.

First, the semiconductor packages in the half-finished product state, individualized through the cutting process, are seated on a base board 90. In this example, in the semiconductor packages in the half-finished product state, lower portions of side surfaces of the substrates 10 are spaced apart from the base board 90 by the spacing parts 50.

As an example of the base board 90, a film, an adhesive tape, a gel pad may be used. However, the base board 90 is not limited thereto.

A conductive material is then applied to surfaces of the semiconductor packages in the half-finished product state, seated on the base board 90, by sputtering deposition or a conformal coating scheme, to form the blocking film 40. The blocking film 40 may be a metal coating layer.

The blocking film 40 is formed on the side surfaces of the substrate 10, as well as on surfaces of the sealing part 30.

Therefore, the blocking film 40 is connected to the ground electrode 21, exposed through the side surface of the substrate 10.

In the present process, a blocking film 41 is formed on one surface of the base board 90, exposed externally as well as on a surface of the semiconductor package.

In general, the conductive material (for example, a coating particle) forming the blocking film 40 is applied from an upper portion of the semiconductor package. Therefore, it is difficult for the conductive material to be introduced into the spacing part 50, such that the conductive material is not substantially applied to the first and second surfaces 51 and 52 of the spacing part 50.

The blocking film 40 is not formed in the spacing part 50, or a much smaller amount of blocking film 40 than an amount of blocking film 40 formed on the side surface of the substrate 10 is formed in a thin layer on the first surface 51, even though the blocking film 40 is formed in the spacing part 50.

Therefore, the blocking film 41 formed on the base board 90 and the blocking film 40 formed on the surface of the semiconductor package 100a are discontinuously formed without being connected to each other, by the spacing part 50.

The semiconductor package 100a is then separated from the base board 90, and the connection terminals 25 are bonded to the external connection electrodes 16, to complete the semiconductor package 100a illustrated in FIG. 1. In the present example, the connection terminals 25 are formed after the blocking film 40 is formed. However, the connection terminal 25 may also be formed before the blocking film 40 is formed, if necessary.

Since the blocking film 41 formed on the base board 90 is separated from the blocking film 40 formed on the semiconductor package 100a by the spacing part 50, the semiconductor package 100a is easily and reliably separated from the base board 90.

In an example in which the spacing part 50 is not present, the blocking film 41 formed on the base board 90 and the blocking film 40 formed on the semiconductor package 100a are continuously connected to each other. In this example, when the semiconductor package 100a is forcibly separated from the base board 90, the blocking film 41 formed on the base board 90 and the blocking film 40 formed on the semiconductor package 100a are separated from each other such that they are torn. The separation may result in a burr being generated in the torn portion of the blocking film 41 and the blocking film 40, which may lead to a defect of the product.

In addition, a process of separating the blocking film 41 formed on the base board 90 and the blocking film 40 formed on the semiconductor package 100a from each other needs to be additionally performed in order to prevent the generation of the burr, and thus a manufacturing process may be complicated.

However, as described above, in the semiconductor package 100a, these problems are solved through the use of the spacing part 50.

In an example in which the width B of the second surface 52, equivalent to the width of the spacing part 50, is excessively narrow, the blocking film 40 applied onto the side surface of the substrate 10 and the blocking film 41 applied onto the base board 90 may be connected to each other. Therefore, a vertical distance B (for example, the width of the second surface) between the side surface of the substrate 10 and the lower surface of the substrate 10 may need to be greater than a thickness of the blocking film 40, and may be, for example, at least twice the thickness of the blocking film 40.

In addition, in an example in which the width A (for example, a horizontal distance) of the first surface 51 is excessively narrow, the blocking film 40 may be applied onto the second surface 52. In this example, the blocking film 41 applied onto the base board 90 and the blocking film 40 applied onto the second surface 52 may be integrally connected to each other, such that it is difficult to easily separate the semiconductor package 100a from the base board 90.

Therefore, in the disclosed example, the width A of the first surface 51 may be greater than the width B of the second surface 52. However, the widths of the first and second surfaces are not limited thereto.

In addition, since a range of the width A of the first surface 51 is limited by the external connection electrode 16 disposed on the lower surface of the substrate 10, the range of the width A of the first surface 51 is substantially greater than the width B of the second surface 52 and located between the external connection electrode 16 and the outer edge of the substrate 10.

In FIG. 3E, in an example in which a vertical incident angle of the conductive material is 30° or 45°, the conductive material may not be applied onto the second surface 52.

In general, the vertical incident angle of the conductive material is defined in a range of 30° to 60° (45°±15°), and thus a maximum vertical incident angle of the conductive material is 60°. Therefore, when a phenomenon where the conductive material is applied onto the second surface 52 at an incident angle of 60° is prevented, or a thickness of the conductive material applied to the second surface 52 is significantly reduced, formation of the burr during separation of the semiconductor package from the base board 90 is prevented.

In an example in which the vertical incident angle of the conductive material is 60°, a ratio (A/B) of A to B in relation to the horizontal distance A and the vertical distance B of the groove of the spacing part 50 is calculated as tan 60° (about 1.8).

Therefore, when the ratio (A/B) of A to B is limited to 1.8 or more, even though the vertical incident angle of the conductive material is 60°, a phenomenon where the conductive material is applied onto the second surface is prevented, and a thickness of the conductive material is significantly reduced, even though the conductive material is applied onto the second surface.

Therefore, in the semiconductor package, the ratio (A/B) of A to B satisfies Equation 1.

$$1.8 \leq A/B \leq 2.2 \quad \text{(Equation 1)}$$

Here, A is the width of the first surface, and B is the width of the second surface.

In an example in which the width A of the first surface is excessively increased, a ductile base board 90 may adhere to the first surface 51 of the spacing part 50. Therefore, in order to prevent such a problem, the width A of the first surface 51 is limited.

During various measurement testing, applicants found that changing the widths of the first surface 51 and the second surface 52, in examples where the ratio (A/B) of A to B exceeds 2.2, a phenomenon where the base board 90 is attached to the first surface 51 of the spacing part 50 occurs. Therefore, an upper limit of the ratio (A/B) of A to B may be set to approximately 2.2; however, the ratio may deviate slightly.

The semiconductor package according to the present disclosure is not limited to the above-mentioned examples. A semiconductor package according to an example described below has a structure similar to that of the semiconductor package 100 (see FIG. 1) according to the above-mentioned examples except for a structure of a spacing part 50. Therefore, a detailed description of the same components will be omitted. In addition, the same components as those of the above-mentioned examples will be denoted by the same reference numerals.

Figure 4:
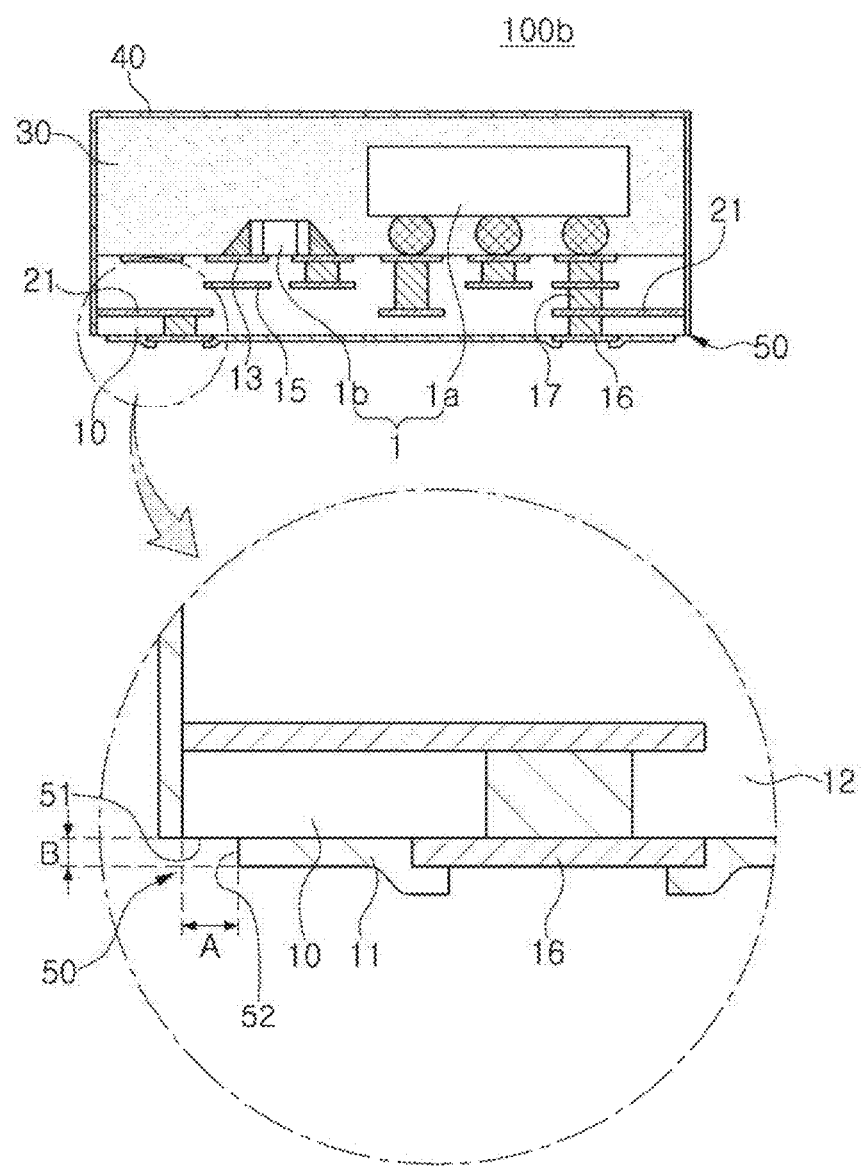
FIG. 4 is a cross-sectional view illustrating another example of a semiconductor package.

FIG. 4 is a cross-sectional view illustrating another example of a semiconductor package.

Referring to FIG. 4, a substrate 10 of a semiconductor package 100b includes at least one insulating layer 12, a wiring layer disposed on a lower surface of the insulating layer, and an insulation protecting layer 11 formed on the lower surface of the insulating layer 12, while covering the wiring layer.

Here, the insulating layer 12 refers to an interlayer insulating layer disposed among a plurality of wiring layers. In detail, the insulating layer 12 refers to an insulating layer that is formed at the lowest portion of the substrate 10. In addition, the wiring layer, which is a circuit wiring formed on the lower surface of the insulating layer, refers to a wiring layer on which external connection electrodes 16 are formed in the present example.

The insulation protecting layer 11 protects the wiring layer or the external connection electrodes 16 formed on the lower surface of the insulating layer 12, and may be, for example, an insulating film formed of a solder resist.

The insulation protecting layer 11 is formed to have an area smaller than that of a lower surface of the substrate 10, on the lower surface of the insulating layer 12.

In addition, an outer edge of the insulation protecting layer 11 is disposed to be spaced apart from an outer edge of the insulating layer 12 by a predetermined distance. Therefore, an edge portion of the insulating layer 12 is exposed externally from the insulation protecting layer 11, and the substrate 10 has a spacing part 50 formed between the insulating layer 12 and the insulation protecting layer 11.

In more detail, the spacing part 50 is formed by a thickness B of the insulation protecting layer 11 and a width A of the insulating layer 12, externally exposed from the insulation protecting layer 11, and, satisfies a ratio (A/B) of A to B according to the above-mentioned Equation 1.

Meanwhile, although not illustrated, the insulation protecting layer may also be formed in the substrate 10 according to the above-mentioned example. However, in the above-mentioned example, the insulation protecting layer is formed over the entire lower surface of the insulating layer, and thus the spacing part is not formed by the insulation protecting layer.

In the present example, the insulation protecting layer 11 and the spacing part 50 are simultaneously formed by limiting an area, a position, and a shape of the insulation protecting layer 11 during formation of the insulation protecting layer 11 on the lower surface of the substrate 10. Therefore, the groove does not need to be separately formed in the strip substrate, and thus the semiconductor package may be easily manufactured.

Figure 5:
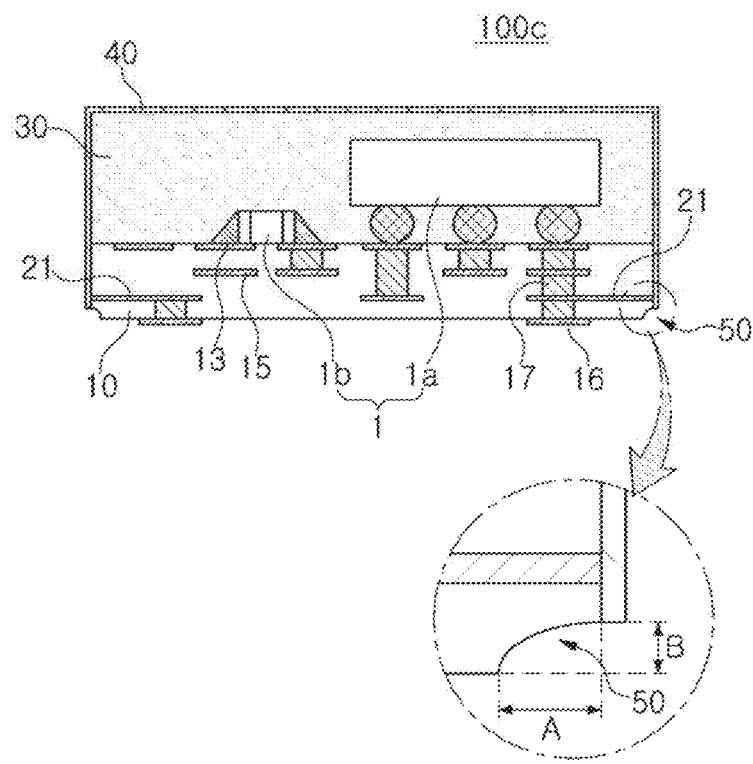
FIGS. 5 and 6 are cross-sectional views illustrating other examples of semiconductor packages.
Figure 6:
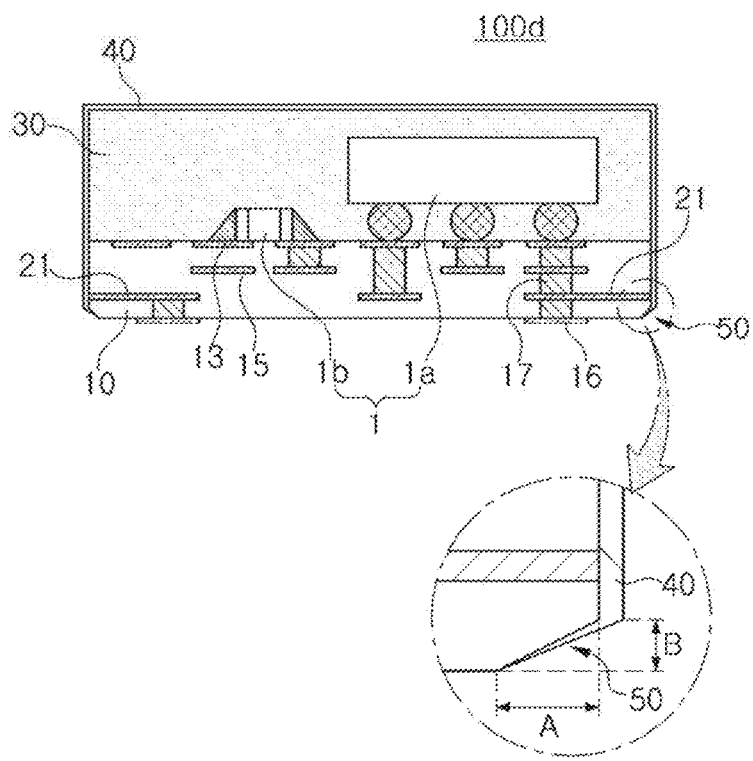

FIGS. 5 and 6 are cross-sectional views illustrating examples of semiconductor packages.

In a semiconductor package 100c illustrated in FIG. 5, a spacing part 50 is not formed in a step shape, but is formed as a groove having a curved surface shape. In addition, in a semiconductor package 100d illustrated in FIG. 6, a spacing part 50 is formed to have an inclined surface shape. Here, each spacing part 50 has a horizontal distance A corresponding to the first surface of FIG. 1 and a vertical distance B corresponding to the second surface of FIG. 1, and a ratio (A/B) of A to B satisfying Equation 1.

As described above, the spacing part 50 is formed in various shapes, as long as it spaces the blocking film 40, formed on the side surface of the substrate 10, and the blocking film 41 (see FIG. 3E) formed on the base board 90, to be apart from each other.

Figure 7:
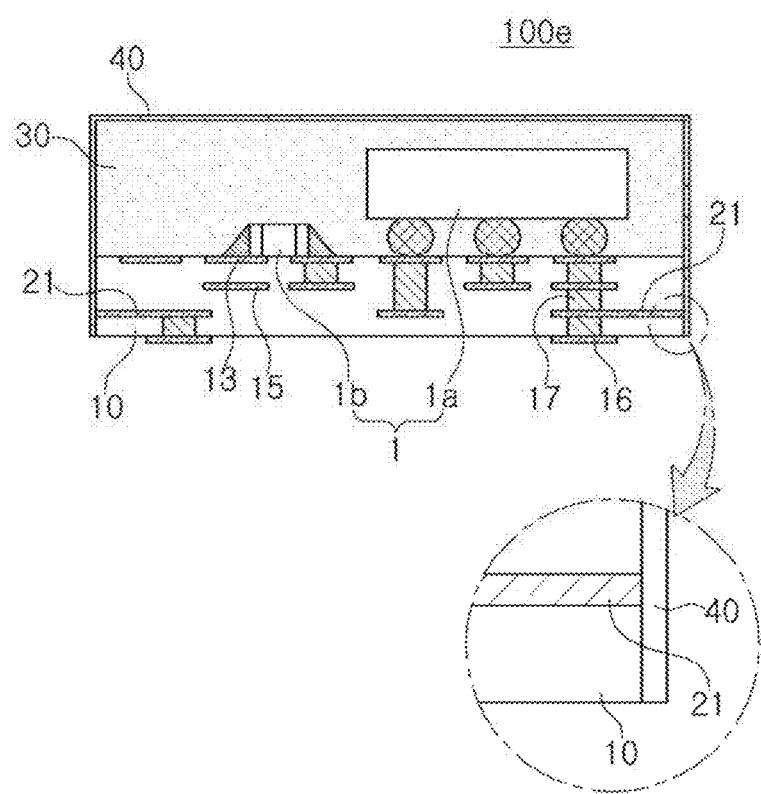
FIG. 7 is a cross-sectional view illustrating another example of a semiconductor package.

FIG. 7 is a cross-sectional view illustrating another example of a semiconductor package.

Referring to FIG. 7, a semiconductor package 100e does not include a spacing part. Therefore, a blocking film 40 is formed up to an edge of a lower surface of a substrate 10. However, the blocking film 40 does not allow a burr to protrude downward of the substrate 10.

This configuration is further clarified by a description of a method of manufacturing a semiconductor package, provided below.

Figure 8A:
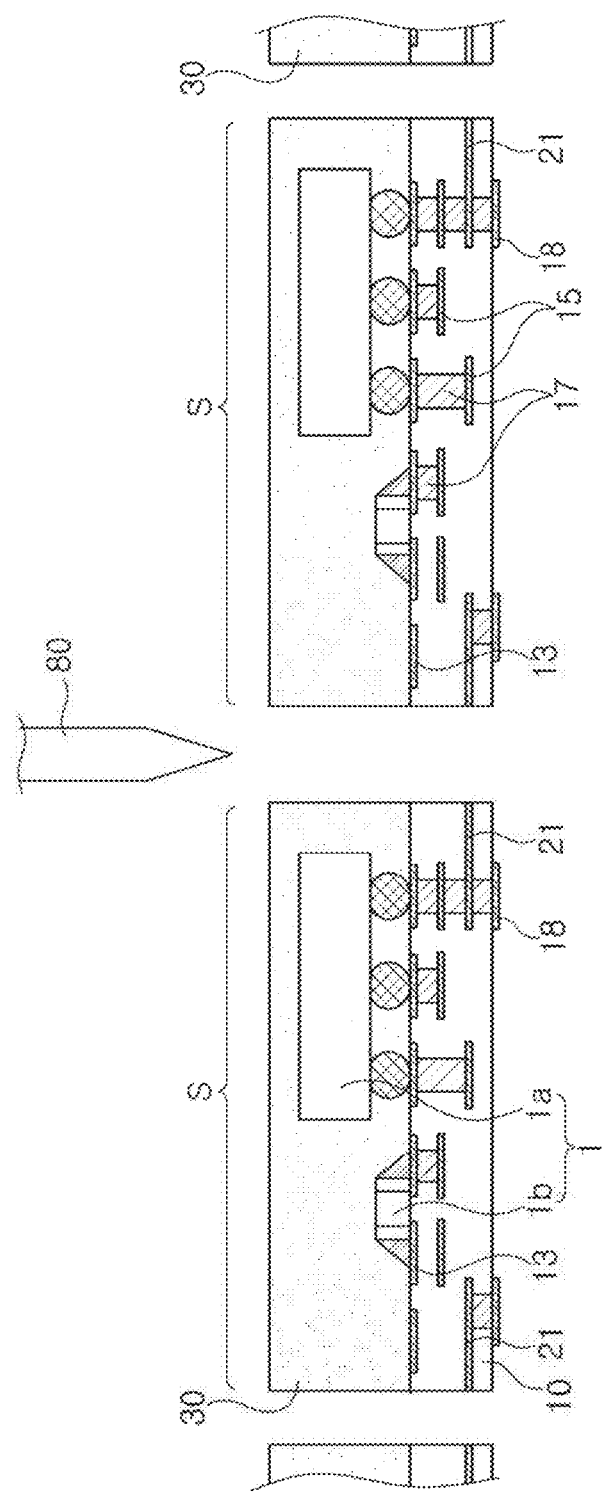
FIGS. 8A through 8C are views for describing an example of a method of manufacturing the semiconductor package illustrated in FIG. 7.
Figure 8B:
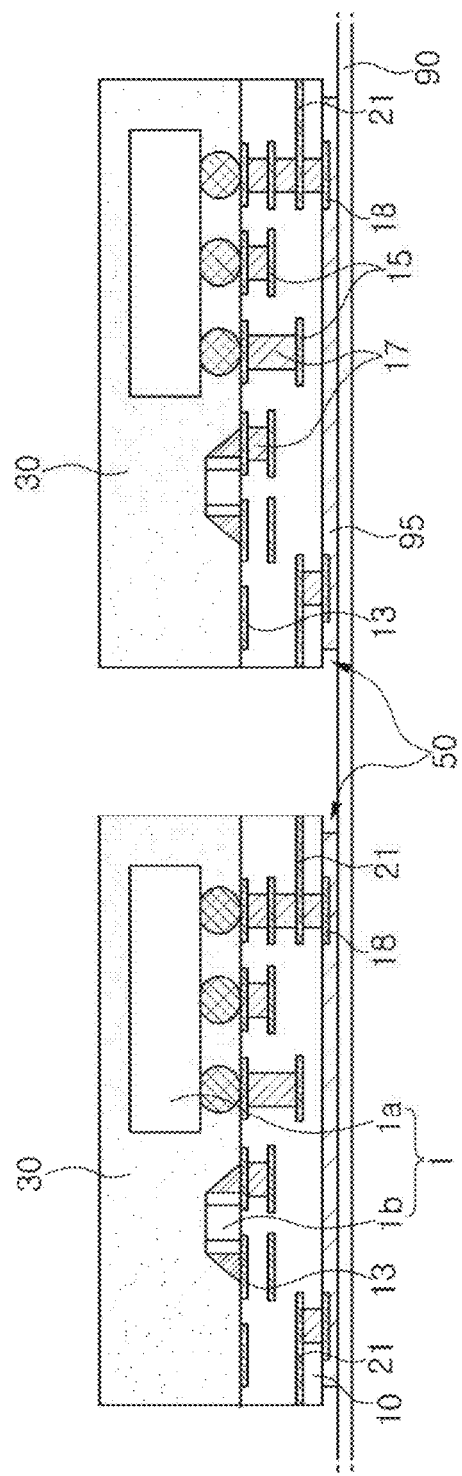
Figure 8C:
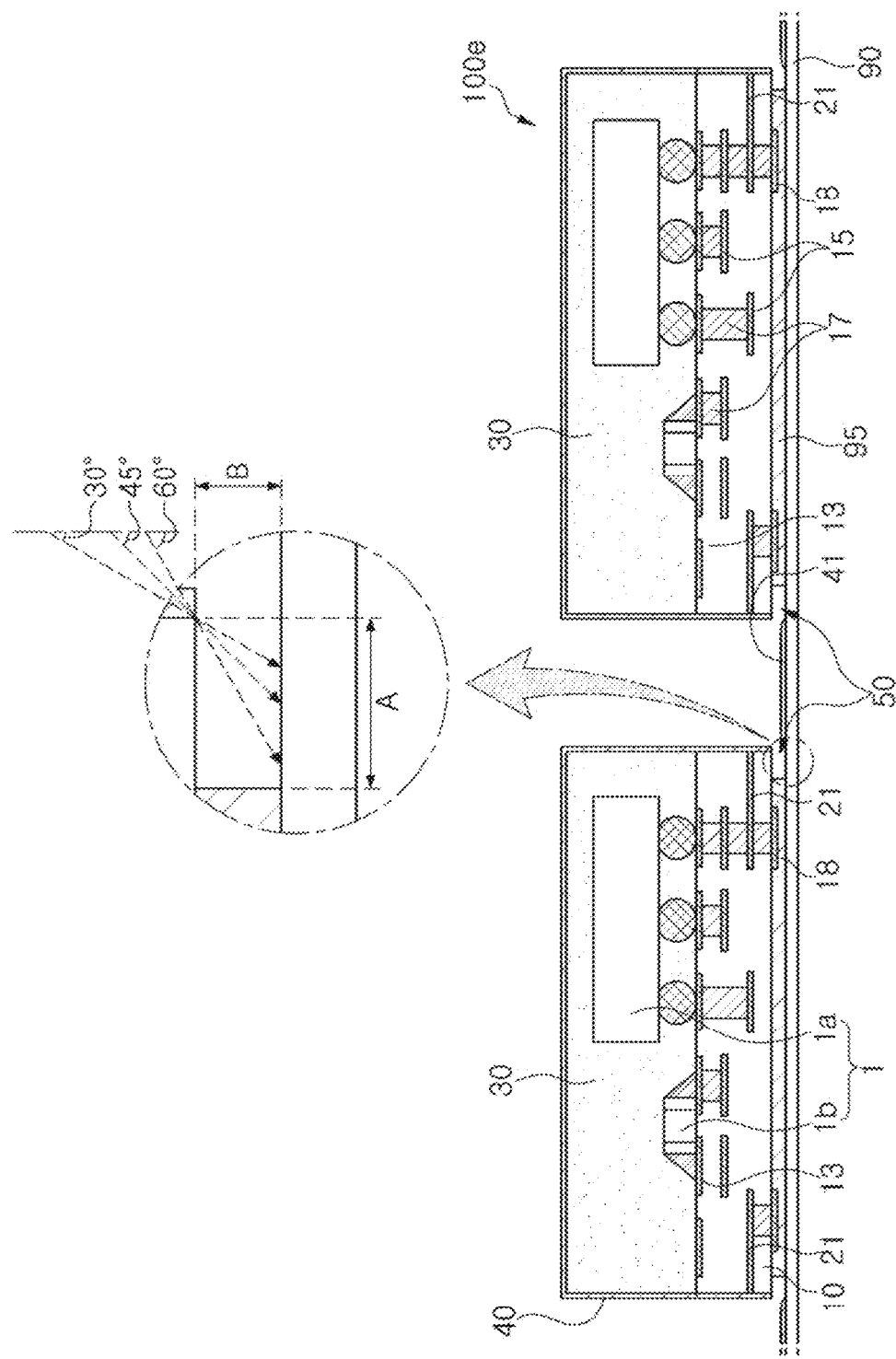

FIGS. 8A through 8C are views describing an example of a method of manufacturing the semiconductor package illustrated in FIG. 7.

First, referring to FIG. 8, in the method of manufacturing the semiconductor package, a strip substrate 10 excluding the groove 50a (see FIG. 3A) is prepared. Then, the electronic devices 1 are mounted on the strip substrate 10, and the sealing part 30 is formed.

Then, the strip substrate 10 is cut along a boundary between individual package regions S.

Following this, as illustrated in FIG. 8B, semiconductor packages in a half-finished product state, individualized through a cutting process, may be seated on a base board 90.

Here, the base board 90 includes a support layer 95 formed on one surface thereof. The support layer 95 is provided in order to support the semiconductor package in the half-finished product state, and is formed to have an area smaller than that of a lower surface of the substrate 10 of the semiconductor package, to be interposed between the base board 90 and the substrate 10.

When the substrate 10 is seated on the support layer 95, an edge portion of the lower surface of the substrate 10 is exposed externally from the support layer 95, such that a lower portion of a side surface of the substrate 10 is spaced apart from the base board 90. Therefore, a step structure corresponding to that of the spacing part 50 (see FIG. 1), according to the above-mentioned example, is formed by the support layer 95.

The support layer 95 is a part protruding from the base board 90. However, the support layer 95 is not limited thereto, but may also be separately manufactured and then stacked on the base board 90. In this example, a film, a substrate, an adhesive tape, or a pad having a gel form may be used as the support layer 95. However, the support layer 95 is not limited thereto.

Then, as illustrated in FIG. 8C, a conductive material is applied to a surface of the semiconductor package seated on the base board 90 by a sputtering deposition or conformal coating scheme, to form the blocking film 40. Therefore, the blocking film 40 becomes formed of a metal coating layer.

In addition, the blocking film 40 is not be connected to a blocking film 41 formed on the base board 90 due to the step structure formed by the support layer 95 and the substrate 10 of the semiconductor package.

Here, the step structure described above includes a width A of the substrate 10, exposed externally from the support layer 95, and a thickness B of the support layer 95, and satisfies a ratio (A/B) of A to B in the above-mentioned Equation 1.

The semiconductor package 100e is then separated from the base board 90 to complete the semiconductor package 100e, illustrated in FIG. 7. As described above, in the semiconductor package 100e, the spacing part 50 is not be included in the substrate 10. However, due to the step structure formed by the support layer 95 and the substrate 10, the creation of the burr in the blocking film 40 is prevented even though the semiconductor package 100e is separated from the base board 90.

As set forth above, in the semiconductor package according to the present disclosure, a phenomenon where the blocking film applied onto the base board and the surface of the semiconductor package are connected to each other during formation is prevented by the spacing part formed on the substrate. Therefore, the formation of burr during the manufacturing separation process of separating the blocking film is prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
    a substrate comprising a mounted electronic device;
    a sealer configured to seal the electronic device; and
    a conductive blocking film disposed on a surface of the sealer and a side surface of the substrate,
    wherein the substrate comprises a spacer formed along an outer edge of a lower surface of the substrate to space the side surface of the substrate and the lower surface of the substrate to be apart from each other, and
    wherein a lower surface of the conductive blocking film that is adjacent to the substrate, is on a same plane as a horizontal surface of the spacer.

2. The semiconductor package of claim 1, wherein the spacer has a step shape.

3. The semiconductor package of claim 2, wherein the spacer comprises:
    a first surface horizontally extending from a lower portion of the side surface of the substrate; and
    a second surface vertically extending from the first surface and connected to the lower surface of the substrate.

4. The semiconductor package of claim 1, wherein the spacer is formed as an inclined surface or a curved surface.

5. The semiconductor package of claim 3, wherein, in the spacer, a width of the first surface is greater than a width of the second surface.

6. The semiconductor package of claim 1, wherein a vertical spaced distance between the side surface of the substrate and the lower surface of the substrate is greater than a thickness of the conductive blocking film.

7. The semiconductor package of claim 1, wherein the spacer is formed in a shape of a groove, and
a ratio of a horizontal distance of the groove and a vertical distance of the groove is $1.8 \leq A/B \leq 2.2$, where A is the horizontal distance of the groove and B is the vertical distance of the groove.

8. The semiconductor package of claim 1, wherein the surfaces of the spacer are exposed through the conductive blocking film.

9. A semiconductor package, comprising:
a substrate comprising a mounted electronic device;
a sealer configured to seal the electronic device; and
a conductive blocking film disposed on a surface of the sealer and a side surface of the substrate,
wherein the substrate comprises a spacer formed along an outer edge of a lower surface of the substrate to space the side surface of the substrate and the lower surface of the substrate to be apart from each other,
wherein the substrate comprises an insulating layer, a wiring layer disposed on a lower surface of the insulating layer, and an insulation protecting layer formed on the lower surface of the insulating layer while covering the wiring layer, and
wherein the spacer is formed by a difference in an area between the insulating layer and the insulation protecting layer.

10. A semiconductor package, comprising:
a substrate comprising an electronic device, the substrate having a first periphery surface and a second periphery surface;
a sealer disposed to seal the electronic device; and
a conductive blocking film disposed on a surface of the sealer and the first periphery surface the substrate,
wherein the first periphery surface has a larger perimeter than a perimeter of the second periphery surface, and
wherein a lower surface of the conductive blocking film that is adjacent to the substrate, is on a same plane as a lower surface of the first periphery surface.

11. The semiconductor package of claim 10, wherein a lower portion of the first periphery surface and the second periphery surface define a groove.

12. The semiconductor package of claim 11, wherein a ratio of a horizontal depth and a vertical height of the groove is defined by $1.8 \leq A/B \leq 2.2$, where A is the horizontal depth and B is the vertical height.

* * * * *